(12) United States Patent
Stefanoff et al.

(10) Patent No.: US 9,095,069 B2
(45) Date of Patent: Jul. 28, 2015

(54) DIRECT MECHANICAL/ELECTRICAL PRINTED CIRCUIT BOARD INTERFACE

(76) Inventors: Buddy A. Stefanoff, Collinsville, OK (US); Dana D. Stefanoff, Collinsville, OK (US)

( * ) Notice: Subject to any disclaimer, the term of this patent is extended or adjusted under 35 U.S.C. 154(b) by 276 days.

(21) Appl. No.: 13/243,538

(22) Filed: Sep. 23, 2011

(65) Prior Publication Data

US 2012/0073864 A1    Mar. 29, 2012

Related U.S. Application Data

(60) Provisional application No. 61/385,612, filed on Sep. 23, 2010.

(51) Int. Cl.
*H05K 1/11* (2006.01)
*H05K 1/14* (2006.01)
*H05K 3/40* (2006.01)
*H05K 3/36* (2006.01)

(52) U.S. Cl.
CPC ............ *H05K 1/142* (2013.01); *H05K 3/403* (2013.01); *H05K 3/36* (2013.01); *H05K 2201/09172* (2013.01); *H05K 2201/1059* (2013.01); *H05K 2201/10106* (2013.01); *Y10T 29/4913* (2015.01)

(58) Field of Classification Search
CPC ............ H01R 12/52; H05K 2201/209; H05K 2201/09172; H05K 1/117; H05K 3/403; H05K 2201/09181

USPC ................... 257/730; 439/65, 32, 5
See application file for complete search history.

(56) References Cited

U.S. PATENT DOCUMENTS

| | | | | |
|---|---|---|---|---|
| 4,687,695 A * | 8/1987 | Hamby | ......................... | 428/192 |
| 4,950,527 A * | 8/1990 | Yamada | ......................... | 428/192 |
| 5,006,920 A * | 4/1991 | Schafer et al. | ................ | 257/700 |
| 5,110,298 A * | 5/1992 | Dorinski et al. | ................. | 439/65 |
| 5,325,267 A * | 6/1994 | Ewing | ............................ | 361/760 |
| 6,304,082 B1 * | 10/2001 | Gualtieri et al. | ............... | 324/252 |
| 6,440,775 B2 * | 8/2002 | Khoury | ........................... | 438/107 |
| 2002/0080590 A1 * | 6/2002 | Bauermeister | ................ | 361/803 |
| 2004/0214466 A1 * | 10/2004 | Lin | ................................. | 439/325 |
| 2006/0139932 A1 * | 6/2006 | Park | .............................. | 362/294 |
| 2006/0289201 A1 * | 12/2006 | Kim et al. | ....................... | 174/261 |
| 2007/0155194 A1 * | 7/2007 | Vega Martinez | ................ | 439/62 |
| 2009/0044969 A1 * | 2/2009 | Ishii et al. | ....................... | 174/255 |
| 2010/0103664 A1 * | 4/2010 | Simon et al. | ................... | 362/234 |

* cited by examiner

*Primary Examiner* — Tuan T Dinh
*Assistant Examiner* — Steven T Sawyer
(74) *Attorney, Agent, or Firm* — John M. Behles

(57) ABSTRACT

A printed circuit board is disclosed. The board has a first end having a plurality of fingers in a cooperating relationship with a second end of a second adjacent circuit board. The board has a second end having a second plurality of fingers in a cooperating relationship with a first end of a first adjacent circuit board. The board has a first portion of an electrical trace on at least one of the first plurality of fingers positioned to allow an electrical connection to the second end of the second adjacent circuit board, and a second portion of the electrical trace on at least one of the second plurality of fingers positioned to allow an electrical connection to the first end of the first adjacent circuit board.

20 Claims, 6 Drawing Sheets

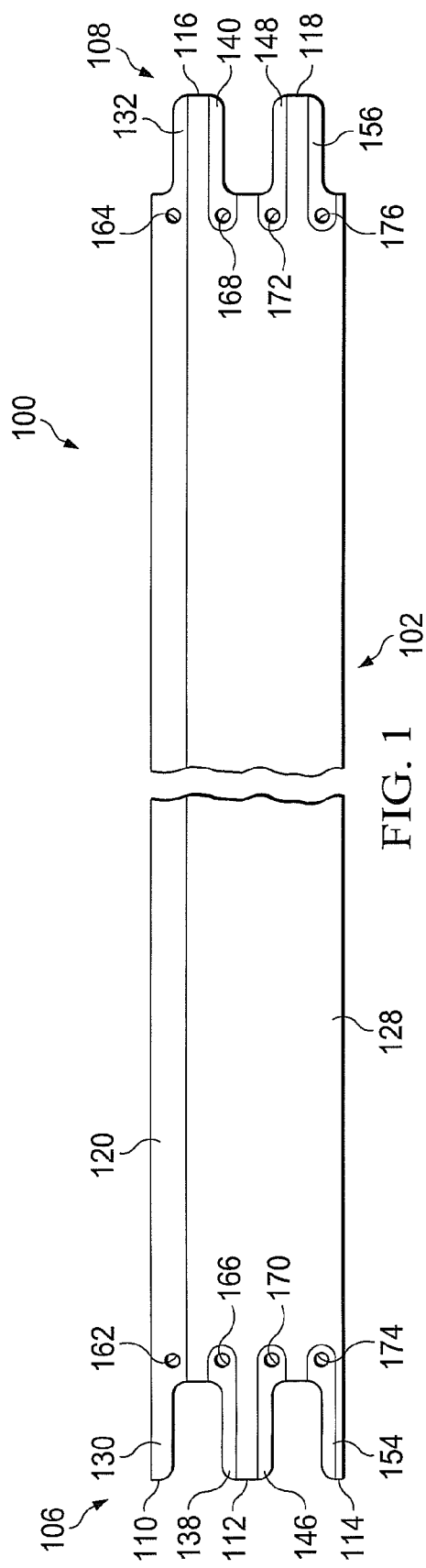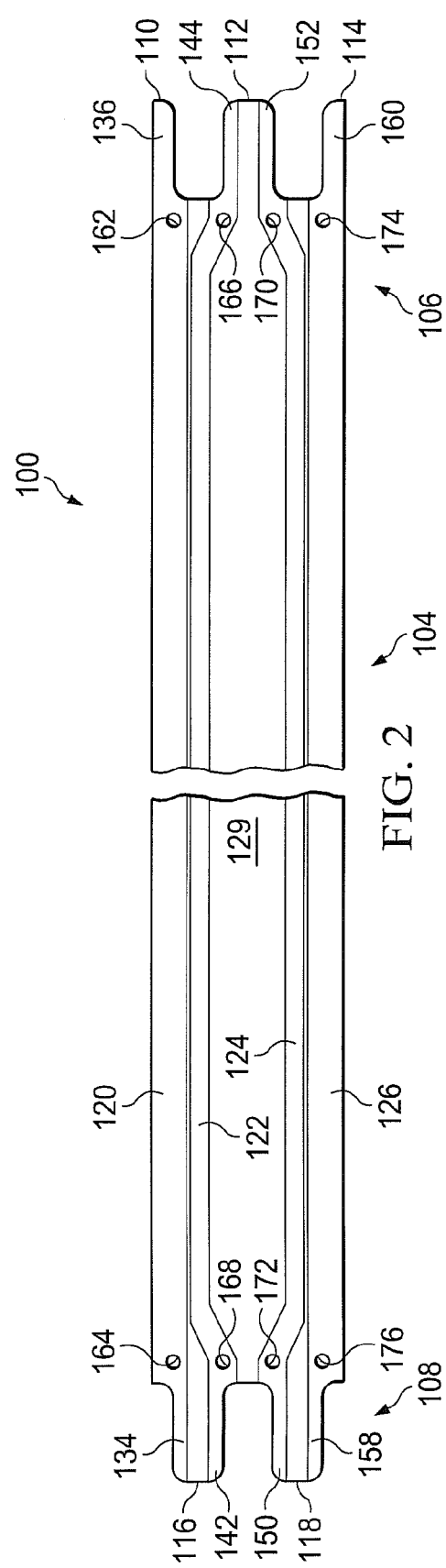

DIRECT MECHANICAL/ELECTRICAL PRINTED CIRCUIT BOARD INTERFACE

CROSS REFERENCE TO RELATED APPLICATIONS

This application claims the priority of U.S. Provisional Patent Application No. 61/385,612 entitled "DIRECT MECHANICAL/ELECTRICAL PRINTED CIRCUIT BOARD INTERFACE," filed Sep. 23, 2010, the contents of which are hereby incorporated by reference.

FIELD OF THE INVENTION

This disclosure relates to circuit boards in general and, more particularly to printed circuit board interfaces for LED lighting systems.

BACKGROUND OF THE INVENTION

Both conventional light bulbs and light emitting diodes (LEDs) are sometimes installed along a path or line. For example, aircraft or theatre lighting may be installed along a floor mounted strip. Marker and mood lights may also be installed linearly. Lights can be wired and then attached to a retaining device or installed in a tube, or similar.

In some cases, incandescent bulbs, LEDs, and other electronic devices are mounted on a printed circuit board (PCB). The various circuit boards may be electrically connected, but in the past this has required substantial additional labor for wiring of the boards. In some cases pins, sliders, or other specialty fasteners are required.

What is needed is a system for addressing the above and related concerns.

SUMMARY OF THE INVENTION

The invention of the present disclosure, in one aspect thereof comprises a printed circuit board. The printed circuit board has a first end having a plurality of fingers in a cooperating relationship with a second end of a second adjacent circuit board. The board has a second end having a second plurality of fingers in a cooperating relationship with a first end of a first adjacent circuit board. The board also has a first portion of an electrical trace on at least one of the first plurality of fingers positioned to allow an electrical connection to the second end of the second adjacent circuit board, and a second portion of the electrical trace on at least one of the second plurality of fingers positioned to allow an electrical connection to the first end of the first adjacent circuit board.

In some embodiments the first plurality of fingers cooperates with the second end of the second adjacent circuit board by a friction fit. The board may also have a top side and a bottom side, where the electrical trace runs on the top side of the circuit board. In some embodiments the trace runs on the bottom side of the printed circuit board. The electrical trace may run from the first end of the printed circuit board to the second end of the printed circuit board in a manner accessible to electrical components along the printed circuit board. The components may include at least one light emitting diode (LED). At least one heat sink may also be mounted to the printed circuit board.

The invention of the present disclosure, in another aspect thereof comprises a method of providing light emitting diode (LED) illumination support. The method includes providing an elongated printed circuit board having a first end and a second end and an upper side and a lower side. A plurality of fingers are formed in the first end and a plurality of fingers are formed in the second end. The fingers of the first end are configured to interlock with a plurality of fingers on a second end of an adjacent substantially identical circuit board. The fingers of the second end are configured to interlock with a plurality of fingers on a first end of an adjacent substantially identical circuit board. The method includes forming a plurality of electrical traces along the elongated body. The method also includes forming first and second terminals for each of the respective electrical traces, the first terminal being formed on one of the plurality of fingers on the first end and the second terminal being formed on one of the plurality of fingers on the second end. Each of the terminals comprises an electrical contact surface on an upper surface of the finger and an electrical contact surface on a lower surface of the finger such that when the fingers are interlocked with adjacent substantially identical circuit boards, the respective electrical contact surfaces will lie adjacent and be accessible from both sides of the circuit board.

In some embodiments, the method includes soldering at least one of the electrical contacts to the adjacent contact. The method may also include forming a plurality of heat sinks on the elongated body. A plurality of LEDs may be surface mounted on the elongated body and electrically connected to at least one of the plurality of electrical traces. The trace connected to the LEDs may be electrically powered. In one embodiment, the method includes mounting at least one LED controller to the elongated body and providing power thereto using one of the plurality of traces and providing a control signal thereto using another one of the plurality of traces.

BRIEF DESCRIPTION OF THE DRAWINGS

FIG. 1 is a plan view of a printed circuit board according to the present disclosure.

FIG. 2 is a view of the reverse side of the printed circuit board of FIG. 1.

DETAILED DESCRIPTION OF THE PREFERRED EMBODIMENTS

Figure 3:
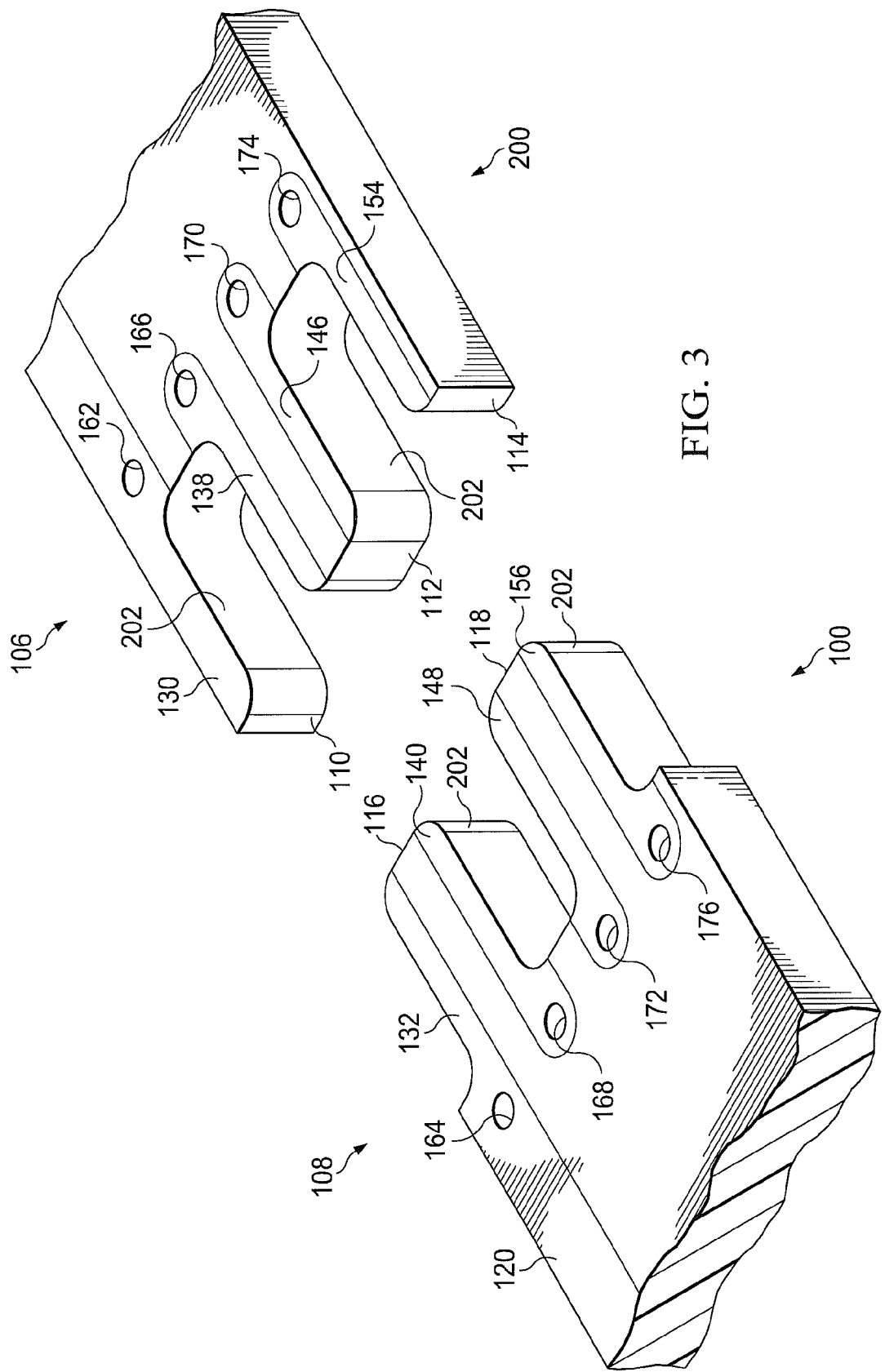
FIG. 3 is a perspective view of the connecting ends of two adjacent printed circuit boards according to the present disclosure.

Referring now to FIG. 1 and FIG. 2, front and back plan views, respectively, of a printed circuit board according to the present disclosure is shown. The printed circuit board 100 has a generally elongated body with a front side 102 and a back side 104. The circuit board 100 also provides a first end 106 and a second end 108. A plurality of interlockable fingers are provided on each of the respective ends 106, 108. In the present embodiment the first end 106 provides a first finger 110, a second finger 112 and third finger 114. The second end 108 provides a fourth finger 116 and a fifth finger 118.

Each of the fingers 110-118 provide a terminal at the first end 106 and the second end 108 comprising contact plates as described below. Traversing the length of the printed circuit board 100 between the ends 106, 108 and the associated terminals are a plurality of electrical pathways. An electrical pathway or trace 120 can be seen traversing the front side 102 between first finger 110 and a portion of fourth finger 116. On the reverse side 104 pathway 122 can be seen proceeding between a portion of the second finger 112 and the third finger 114. Pathway 124 can be seen proceeding from a portion of second finger 112 to fifth finger 118. A fourth pathway 126 can be seen proceeding from third finger 114 to a portion of the fifth finger 118. It will be appreciated that the traces or pathways 120-126 may provide electrical contact points for any devices that may be mounted on the front side 102 or back side 104 of the printed circuit board 100. The pathways 120, 122, 124, 126 may be copper or another suitable conductive metal.

In the present embodiment it can be seen that on the back or reverse side 104 of the printed circuit board 100 the pathways 120-126 are situated so as to define a clear area 129 to allow for mounting of various electronic devices (not shown). In a similar fashion, the front side 102 of printed circuit board 100 provides an area 128 upon which various electrical devices and components (not shown) may be mounted.

As described in greater detail below, it is contemplated that a number of substantially identical printed circuit boards 100 may be constructed and interlocked together at the ends 106, 108. Once connected physically, an electrical connection may be completed between adjacent circuit boards. Each of the fingers 110-118, acting as a terminal for the pathways 120-126, provide the ability to complete an electrical connection on either the front side 102 or the back side 104 of the printed circuit board 100. For example, it can be seen that the first finger 110 provides a contact plate 130 on a front side of the finger 110 and another contact plate 136 on the back side of the finger 110. Finger 112 provides two contact plates on each side since two pathways 122 and 124 are serviced by the finger 112. In the present example on the front side of finger 112 are contact plates 138 and 146 corresponding to pathways 122 and 124, respectively. On the reverse side of the finger 112 contact plates 144 and 152 are provided for pathways 122 and 124, respectively. Finger 114 provides a contact plate 154 on the front side of the finger 114 servicing pathway 126 and provides another contact plate 160 on the reverse side of finger 114.

A similar configuration exists on the second end 108 of printed circuit board 100. Fourth finger 116 services both pathway 120 and 122 of the second end 108. The fourth finger 116 provides a contact plate 132 on the front side and a contact plate 134 on the second side to service pathway 120. Fourth finger 116 provides a contact plate 140 on the front side and a contact plate 142 on the back side for servicing pathway 122. In a similar manner, fifth finger 118 provides contact plates sufficient to service pathways 124 and 126. On the front side fifth finger 118 provides a contact plate 148 and a reverse side provides contact plate 150 for servicing pathway 124. Finally, fifth finger 118 provides contact plate 156 on a front side and contact plate 158 on a rear side for servicing pathway 126.

Continuity from the front side 128 to the back side 129 of the printed circuit board 100 may be provided. This will ensure that regardless of upon which side the connections between circuit boards are completed, the entirety of the pathways 120-126 will be provided with the associated voltage or signal. Accordingly, in the present embodiment, a number of vias are provided for each of the pathways 120-126. In the present embodiments, pathway 120 is provided with vias 162 and 164 passing through the printed circuit board 100 near finger 110 and finger 116, respectively. In a similar manner, pathway 122 is provided with via 168 near finger 116 and via 166 near finger 112. Pathway 124 is provided with via 172 near finger 118 and via 170 near finger 112. Finally, pathway 126 is provided with via 176 near finger 118 and via 174 near finger 114.

Referring now to FIG. 3, a perspective view of the connecting ends of two adjacent printed circuit boards is shown. In the present illustration, the two circuit boards 100 and 200 are shown are identical. Therefore, it can be appreciated that the first end 106 of the circuit board 200, constructed as previously described, will meet with the second end 108 of circuit board 100. From the perspective view of FIG. 3, it can be seen that the circuit boards 100 and 200 provide a certain thickness. This thickness between the front and back sides allow for friction surfaces 202 to be defined between various fingers 110-118. When the respective friction surfaces 202 are engaged by interlocking the respective fingers 110-118, the adjacent boards 100 and 200 will form a single unit with the respective pathways 120-126 on each of the boards 100 and 200, being in a position to be electrically connected.

Figure 4:
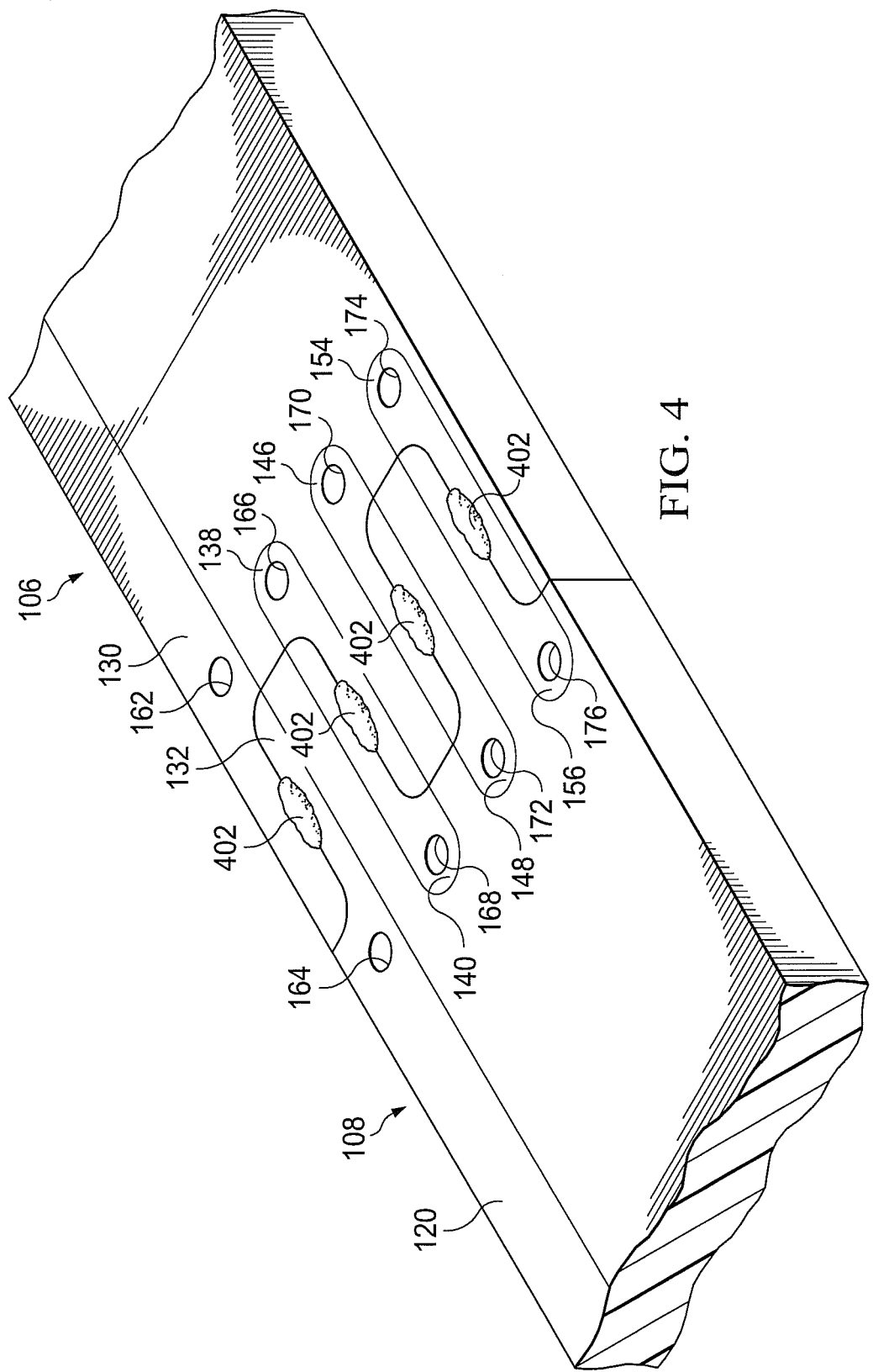
FIG. 4 is a perspective view of the printed circuit boards of FIG. 3 in a connected configuration.

Referring now also to FIG. 4, a perspective view of the printed circuit boards of FIG. 3 are shown in a connected configuration. It will be appreciated that contact plates 130 and 132 lie adjacent; as do contact plates 140 and 138; 146 and 148; and 156 and 154. In some embodiments the contact plates will be constructed such that electrical connection is made any time the fingers are interlocked as shown in the embodiment of FIG. 4. In other embodiments, it may be necessary to install soldering 402 between the respective connections between the contact plates. Application of the soldering 402 may also provide additional mechanical rigidity between adjacent boards.

Figure 5:
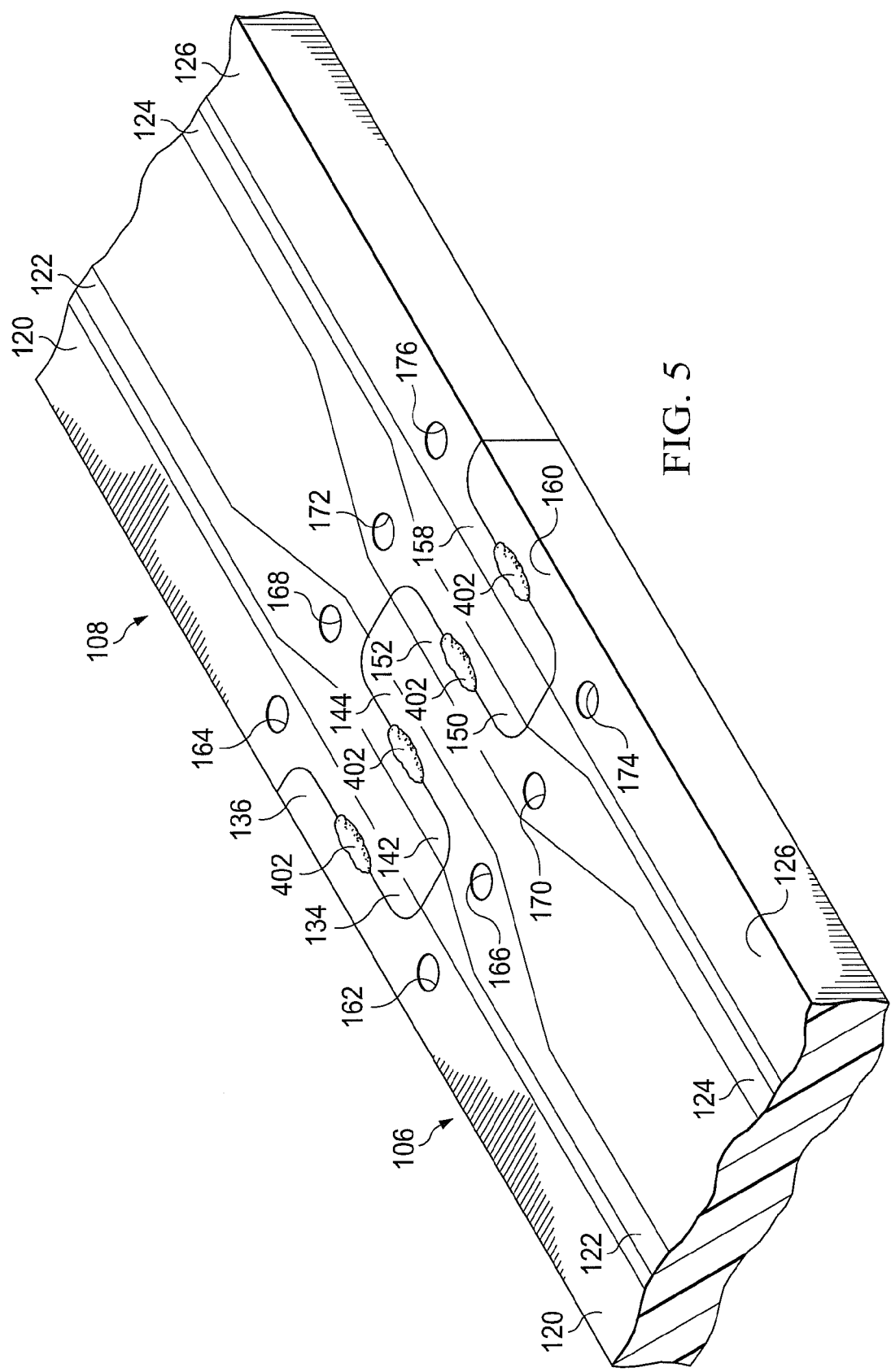
FIG. 5 is a perspective view of reverse side of the printed circuit boards of FIG. 4.

Referring now also to FIG. 5, the reverse side of the interlocked and connected adjacent circuit boards is shown. On the reverse side of FIG. 5, solder connections 402 are again provided. However, the configuration of the printed circuit boards ensure that as long the pathways 120-126 are completed on a single side of the printed circuit board, the vias will propagate the signal to the other side. In this way, it can be appreciated that if soldering is needed to complete the connection, it may be done from either or both sides of the printed circuit board, and will still provide a reliable electrical connection.

Figure 6:
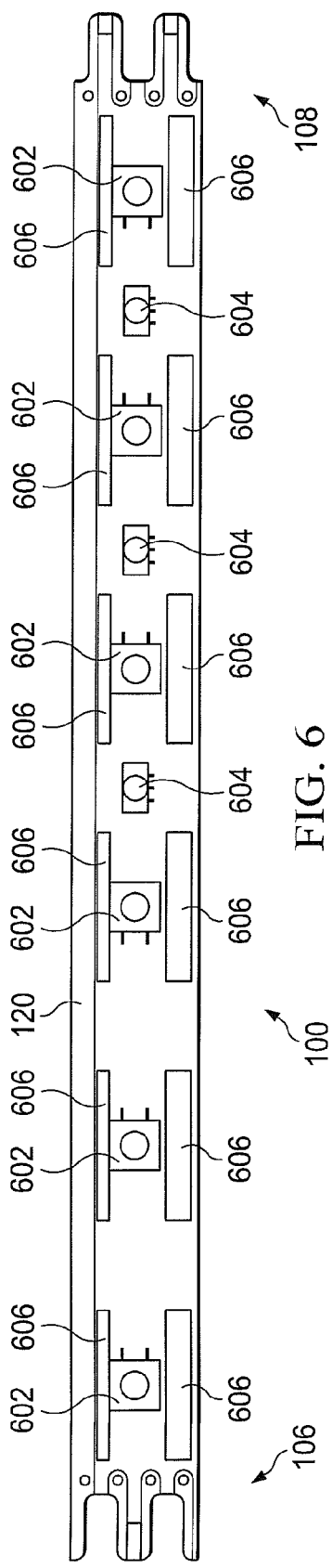
FIG. 6 is a plan view of a printed circuit board according to the present disclosure illustrated exemplary placement of light emitting diodes and supporting circuitry.

Referring now to FIG. 6, a plan view of a printed circuit board according to the present disclosure, is shown with exemplary placement of light emitting diodes (LEDs) and supporting circuitry. In the present embodiment the circuit board 100 has been provided with six LEDs 602. These may be surface-mounted LEDs, pin-mounted, or otherwise. Also on the circuit board, at or near the location of the LEDs 604, are a number of associated heat sinks 606. An LED controller 604 may also be provided on the circuit board 100.

Figure 7:
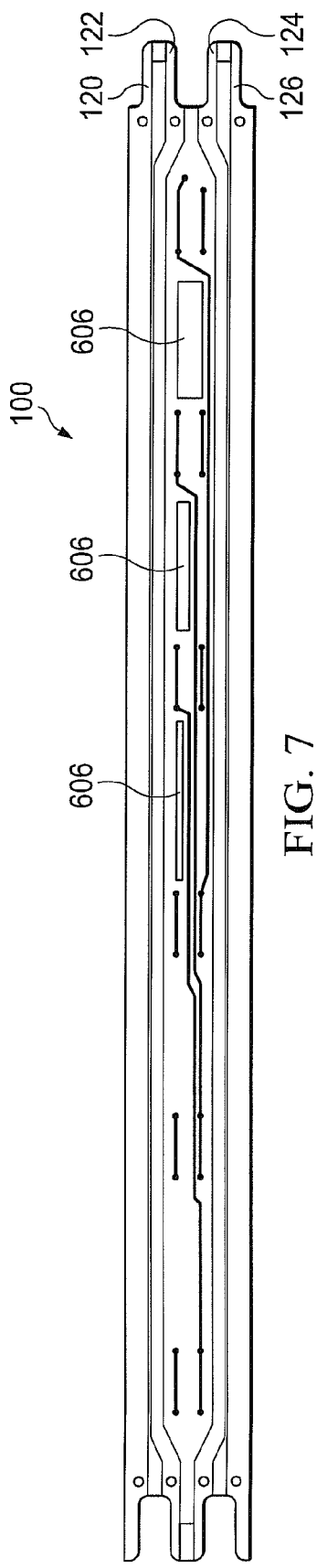
FIG. 7 is a plan view of the reverse side of the printed circuit board of FIG. 6.

Referring now also to FIG. 7, a plan view of the reverse side of the printed circuit board of FIG. 6 is shown. FIGS. 6 and 7 each illustrate how various circuitry components that may be mounted on the front or the reverse side of the printed circuit board 100 through installation of traces and vias can each have access to whatever information, power, or signals are provided on each of the pathways 120, 122, 124 and 126.

Figure 8:
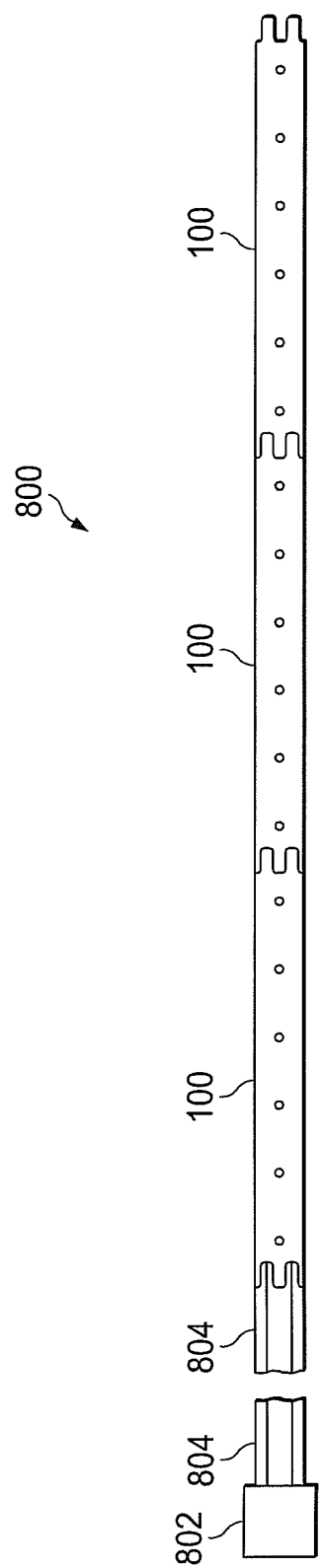
FIG. 8 is a schematic view of a lighting system utilizing printed circuit boards of the present disclosure.

Referring now to FIG. 8, a schematic view of a lighting system utilizing the printed circuit boards of present disclosure is shown. Here the system 800 comprises a control unit 802, a data and power bus 804, and a number of printed circuit boards 100 that have been connected together as previously described. The control computer 802 may be a solid-state, purpose-built device, or some other computing device constructed of off-the-shelf components capable of providing the requisite power and data signals over the data and power bus 804 to the printed circuit boards 100. Through the control computer 802 various voltages and signals, both analog and digital, may be provided on the data bus 804, which will then be made available to the various components installed on the linked printed circuit boards 100 through the previously described end connections that will place each of the pathways 120-126 of the respective printed circuit board 100 at substantially the same power and voltage level.

With reference also to previous figures, in one embodiment, pathway 120 is used for providing a DC voltage. This voltage will be available to any device on the PCB 100 that can connect to this pathway. Devices may include, but are not limited to, processors, chips, and LEDs. Pathway 122, 124, and 126 may each be assigned to a specific LED color in some embodiments (for example, pathway 122 assigned to blue, pathway 124 assigned to green, and pathway 126 assigned to red). These pathways may provide an analog or digital signal path to ground, via field effect transistor (FET), for example. In this way, each PCB 100 may provide both power and multiple signal lines to each device mounted thereto. Each power and/or signal voltage may be propagated to neighboring boards via the physical and electrical interface described in the various embodiments of the present disclosure.

* * *

Thus, the present invention is well adapted to carry out the objectives and attain the ends and advantages mentioned above as well as those inherent therein. While presently preferred embodiments have been described for purposes of this disclosure, numerous changes and modifications will be apparent to those of ordinary skill in the art. Such changes and modifications are encompassed within the spirit of this invention as defined by the claims.

What is claimed is:

1. A printed circuit board comprising:
   an elongated body having a first end and a second end and an upper side and a lower side;
   first, second, and third fingers extending from the first end, each having upper and lower adjacent circuit board;
   fourth and fifth fingers extending from the second end, each having upper and lower surfaces and collectively configured to cooperatively mate with three fingers from a second adjacent board;
   a first electrical pathway traversing the elongated body and having first terminal on the first finger of the first end and a second terminal on the fourth finger of the second end;
   a second electrical pathway traversing the elongated body and having a first terminal on the second finger of the first and a second terminal on the fourth finger of the second end;
   a third electrical pathway traversing the elongated body and having a first terminal on the second finger of the first end and a second terminal on the fifth finger of the second end; and
   a fourth electrical pathway traversing the elongated body and having a first terminal on the third finger of the first and a second terminal on the fifth finger of the second end;
   wherein each of the terminals comprises at least two discrete electrical connection points, one on the upper surface of the respective finger, and one on the lower surface of the respective finger, such that electrical contact with either of the connection points will provide continuity with the respective electrical pathway; and
   wherein each of the fingers further comprise side surfaces not covered by an electrical conductor, the side surfaces providing a friction fit with an adjacent finger of an adjacent printed circuit board.

2. The printed circuit board of claim 1, wherein each of the electrical pathways comprise an upper portion on the upper side of the elongated body and a lower portion on the lower side of the elongated body and at least one via connecting the first and second portions.

3. The printed circuit board of claim 1, further comprising a plurality of light emitting diodes (LEDs) and heat sinks on the upper side of the elongated body, the LEDs being electrically connected to at least one of the four electrical pathways.

4. The printed circuit board of claim 1, wherein one of the electrical pathways provides power to devices on the printed circuit board, one of the pathways provides common ground for the devices on the printed circuit board, and one of the electrical pathways provides a control signal to devices on the printed circuit board.

5. The printed circuit board of claim 2, wherein each of the electrical pathways has one via proximate the first end of the elongated body and one via proximate the second end of the elongated body.

6. The printed circuit board of claim 3, further comprising a plurality of LED controllers on the upper side of the elongated body and a plurality of associated heat sinks on the second side of the elongated body.

7. A method of providing light emitting diode (LED) illumination support, comprising:
   creating a first printed circuit board having a top surface, a bottom surface, a first end, a second end, and a first trace by:
   forming on the first end, a first plurality of fingers, each being defined by a non-conductive sidewall, each of the first plurality of fingers comprising electrical connection means that are associated with the first trace and disposed on top of the non-conductive sidewall;
   the first plurality of fingers being sized to cooperate with a second plurality of fingers formed on a second circuit board;
   forming on the second circuit board a second trace, the second plurality of fingers defined by a non-conductive sidewall;
   forming on each of the second plurality of fingers, electrical connection means that are associated with the second trace and disposed on top of the non-conductive sidewall, wherein the second printed circuit board is identical to the first printed circuit;
   forming on the first and second printed circuit boards, a plurality of shared contact plates that comprise the electrical connection means of the first and second plurality of fingers, each of the plurality of contact plates being divided into two sections, wherein one of the two sections of each of the plurality of contact plates is disposed on the top surface of the first plurality of fingers of the first printed circuit board and the other of the two sections of each of the plurality of contact plates is disposed on the top surface of the second plurality of fingers of the second printed circuit board; and
   wherein the first plurality of fingers of the first end and the second plurality of fingers of the second circuit board, when ioined together, require a soldered connection between the electrical connection means of the first and second plurality of fingers so as to electrically connect the first trace with the second trace.

8. The method of claim 7, further comprising soldering the two sections of each of the plurality of contact plates.

9. The method of claim 7, further comprising forming a plurality of heat sinks on the first printed circuit board.

10. The method of claim 7, further comprising surface mounting a plurality of LEDs on the first printed circuit board and electrically connecting them to at least one of the first and second traces.

11. The method of claim 7, further comprising mounting at least one LED controller to the first printed circuit board and providing power thereto using one of the first and second traces and providing a control signal thereto using another one of the first and second traces.

12. The method of claim 10, further comprising electrically powering the trace connected to the LEDs.

13. A device, comprising:
a first printed circuit board having a top surface, a bottom surface, a first end, a second end, and a first trace;
the first end comprising a first plurality of fingers, each being defined by a non-conductive sidewall, each of the first plurality of fingers comprising electrical connection means that are associated with the first trace and disposed on top of the non-conductive sidewall;
the first plurality of fingers being sized to cooperate with a second plurality of fingers of a second circuit board, the second circuit board comprising a second trace, the second plurality of fingers defined by a non-conductive sidewall, each of the second plurality of fingers comprising electrical connection means that are associated with the second trace and disposed on top of the non-conductive sidewall;
wherein the electrical connection means of the first plurality of fingers comprises:
a first set of contact plates associated with each of both the first and second plurality of fingers, the first set of contact plates being disposed on the to surface;
wherein the electrical connection means of the second plurality of fingers comprises:
a second set of contact plates associated with each of both the first and second plurality of fingers, the second set of contact plates being disposed on the bottom surface,
wherein pairs of the first and second sets of contact plates are electrically coupled together using vias extending from the to surface to the back surface; and
wherein the first plurality of fingers of the first end and the second plurality of fingers of the second circuit board, when joined together, require a soldered connection between the electrical connection means of the first and second plurality of fingers so as to electrically connect the first trace with the second trace.

14. The printed circuit board of claim 13, wherein the first trace runs from the first end of the printed circuit board to the second end of the printed circuit board and in a manner accessible to electrical components along the printed circuit board.

15. The printed circuit board of claim 13, further comprising at least one light emitting diode (LED) electrically connected to the first trace.

16. The printed circuit board of claim 13, further comprising at least one heat sink mounted to the printed circuit board.

17. A device, comprising:
a first printed circuit board having a top surface, a bottom surface, a first end, a second end, and a first trace;
the first end comprising a first plurality of fingers, each being defined by a non-conductive sidewall, each of the first plurality of fingers comprising electrical connection means that are associated with the first trace and disposed on top of the non-conductive sidewall;
the first plurality of fingers being sized to cooperate with a second plurality of fingers of a second circuit board, the second circuit board comprising a second trace, the second plurality of fingers defined by a non-conductive sidewall, each of the second plurality of fingers comprising electrical connection means that are associated with the second trace and disposed on top of the non-conductive sidewall;
wherein the second printed circuit board is identical to the first printed circuit, wherein the first and second printed circuit boards share a plurality of contact plates that comprise the electrical connection means of the first and second plurality of fingers, each of the plurality of contact plates being divided into two sections, wherein one of the two sections of each of the plurality of contact plates is disposed on the top surface of the first plurality of fingers of the first printed circuit board and the other of the two sections of each of the plurality of contact plates is disposed on the top surface of the second plurality of fingers of the second printed circuit board; and
wherein the first plurality of fingers of the first end and the second plurality of fingers of the second circuit board, when joined together, require a soldered connection between the electrical connection means of the first and second plurality of fingers so as to electrically connect the first trace with the second trace.

18. The device according to claim 17, wherein when the two sections of a contact plate are brought together by joining the first and second printed circuit boards, the two sections require electrical coupling before electricity can be communicated between the two sections.

19. The device according to claim 17, wherein each of the plurality of contact plates comprises two vias, one via being disposed on the first printed circuit board and another being disposed on the second printed circuit board.

20. The device according to claim 19, wherein the two vias contact only a single contact plate of the plurality of contact plates on the top surface, and wherein the two sections of each of the plurality of contact plates are coplanar with the top surface.

* * * * *